United States Patent
Saito et al.

(10) Patent No.: US 6,509,251 B2
(45) Date of Patent: Jan. 21, 2003

(54) METHOD OF FORMING A RESIST PATTERN FOR BLOCKING IMPLANTATION OF AN IMPURITY INTO A SEMICONDUCTOR SUBSTRATE

(75) Inventors: Takayuki Saito, Hyogo (JP); Sachiko Hattori, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/094,616

(22) Filed: Mar. 12, 2002

(65) Prior Publication Data

US 2002/0182830 A1 Dec. 5, 2002

(30) Foreign Application Priority Data

Jun. 5, 2001 (JP) .......................... 2001-169475

(51) Int. Cl.[7] ............................................. H01L 21/426
(52) U.S. Cl. ....................... 438/514; 438/952
(58) Field of Search ................................. 438/514, 952, 438/199, 218

(56) References Cited

U.S. PATENT DOCUMENTS

| | | | | | |
|---|---|---|---|---|---|
| 5,962,195 | A | * | 10/1999 | Yen et al. | 430/316 |
| 5,970,351 | A | * | 10/1999 | Takeuchi | 438/300 |
| 5,994,009 | A | * | 11/1999 | Tzu et al. | 430/30 |
| 6,004,843 | A | * | 12/1999 | Huang | 438/241 |
| 6,108,056 | A | * | 8/2000 | Nakajima et al. | 349/38 |
| 6,168,891 | B1 | * | 1/2001 | Shibata | 430/30 |
| 6,303,477 | B1 | * | 10/2001 | Ianovitch | 438/551 |
| 6,403,477 | B1 | * | 6/2002 | Tounai | 438/669 |

* cited by examiner

Primary Examiner—Olik Chaudhuri
Assistant Examiner—Stephen W. Smoot
(74) Attorney, Agent, or Firm—McDermott, Will & Emery

(57) ABSTRACT

The contour of a resist pattern is retreated at a site where a part of the place where a gate wiring is to be disposed, which part is located on an active region, and the place where the resist pattern made of a resist film is to be disposed are near to each other by a predetermined distance or less.

13 Claims, 8 Drawing Sheets

METHOD OF FORMING A RESIST PATTERN FOR BLOCKING IMPLANTATION OF AN IMPURITY INTO A SEMICONDUCTOR SUBSTRATE

BACKGROUND OF THE INVENTION

1. Field of the Invention

The present invention relates to a method of forming a resist pattern and a method of manufacturing a semiconductor device, and more particularly to a method of avoiding adverse effects caused by the deterioration in the precision of the shape of a resist pattern used in the step of implanting an impurity or the like.

2. Description of the Background Art

Hitherto, as a part of the process for manufacturing a semiconductor device, one often implants an ion seed of an impurity only into a desired region among active regions of a semiconductor substrate. At that time, a pattern of resist film (hereafter referred to as "resist pattern") is formed to cover and hide regions where one does not wish to implant ions among the active regions and, with the resist pattern used as a mask, the ion implantation is carried out.

Referring to FIGS. 13 and 14, a problem in the conventional resist pattern will be described. FIG. 14 is an arrow cross-sectional view with respect to lines XIV—XIV of FIG. 13.

In this example, plural active regions are defined on the surface of a semiconductor substrate 5, and the regions on the surface of semiconductor substrate 5 other than the active regions are covered with an oxide film 8. In FIGS. 13 and 14, only one active region 2 is shown as the active regions; however, there are other similar active regions on semiconductor substrate 5. A gate wiring 1 is formed in a linear configuration on this active region 2. In this example, gate wiring 1 is formed to cross the center of active region 2. In each of FIGS. 13 and 14, a resist film 3 is shown on the left side of the Figure; however, this resist film 3 is not for covering active region 2 illustrated in the Figure but is for covering a part or the whole of another adjacent active region not illustrated in the Figure. Therefore, active region 2 and resist film 3 illustrated in the Figure do not overlap with each other although they are near to each other, and there is an interval 12 between active region 2 and resist film 3. In such a case where resist film 3 is near to active region 2 where one wishes to implant an impurity, the resist pattern is disposed to be spaced apart by a certain distance from the active region.

In order to form a resist pattern, a method of photolithography such as described below is typically adopted. First, a resist film is formed once over the entire surface of a substrate. Next, in the case of a positive resist, the portion where it is desired to remove the resist film is exposed to light, and then the portion previously exposed is dissolved and removed with a developing solution. In the case of a negative resist, only a portion where it is desired to leave the resist film is exposed to light, and then the portion previously exposed is dissolved and removed with a developing solution.

If gate wiring 1 is connected to resist film 3 as shown in FIGS. 13 and 14, a phenomenon occurs such that a part of the resist film remains even after the development is carried out because the resist film is not sufficiently exposed to light in the neighborhood of the site where gate wiring 1 is connected to resist film 3, due to diffusion of light caused by the presence of gate wiring 1 at the time of exposure. This phenomenon is referred to as "trailing". The part thus remaining on the substrate will be hereafter referred to as "trailing part" 4. The trailing phenomenon degrades the precision of the shape of the resist pattern.

Further, even if gate wiring 1 is not connected to resist film 3, a trailing phenomenon may also occur and a trailing part 4a may be formed if the interval between gate wiring 1 and resist film 3 is short as shown in FIG. 15.

On the other hand, in accordance with the high integration and scale reduction of semiconductor devices in recent years, there may be cases in which the width of the above-mentioned interval 12 cannot be sufficiently ensured. Trailing part 4 may possibly invade into active region 2 if gate wiring 1 is present on active region 2 and gate wiring 1 is in contact with resist film 3, as shown in FIG. 13, in a situation in which interval 12 is narrow to a certain extent or more. Further, in the example shown in FIG. 15, trailing part 4a connected to gate wiring 1 may possibly cover a part of active region 2 where an impurity is to be implanted.

Since trailing parts 4, 4a are parts where a part of resist film remains, the ion seed of the impurity is blocked by trailing parts 4, 4a although trailing parts 4, 4a are within active region 2 where the impurity is to be implanted. This causes insufficient implantation of the impurity. To describe this referring to the example of FIG. 14, though it is inherently planned to implant an impurity in a range shown by a two-dot chain line from active region 2 down to a certain depth, a loaded part 10 (part where the impurity has been implanted) does not extend to the entire range, and a non-loaded part 11 (part where the impurity has not yet been implanted) remains below trailing part 4. Insufficient implantation into the part where the impurity is to be implanted causes adverse effects on the electrical characteristics of the semiconductor device.

Thus, an object of the present invention is to provide a method of forming a resist pattern and a method of manufacturing a semiconductor device capable of preventing deterioration in the precision of the shape of the resist pattern caused by the trailing phenomenon.

SUMMARY OF THE INVENTION

In order to achieve the aforementioned object, a method of forming a resist pattern of the present invention includes a place information inputting step of receiving a first data including information on a place where a writing is to be disposed on a substrate and a second data including information on a place where a resist pattern for blocking implantation of an impurity into an active region on the substrate is to be disposed, and a resist pattern determining step of determining the resist pattern by retreating a contour of the resist pattern at a site where a part of the place where the wiring is to be disposed, which part is located on the active region, as defined by the first data and the place where the resist pattern is to be disposed as defined by the second data are near to each other by a predetermined distance or less so that the contour of the resist pattern may be located away from the part to correspond to a shape of the part. By adopting this method, one can avoid a situation in which the trailing part covers the active region even if the trailing phenomenon occurs at the site where the part of the place where the wiring is to be disposed, which part is located on the active region, and the place where the resist pattern is to be disposed are near to each other.

In order to achieve the aforementioned object, a method of manufacturing a semiconductor device according to one aspect of the present invention includes a place information inputting step of receiving a first data including information on a place where a gate wiring is to be disposed on a substrate and a second data including information on a place where a resist pattern for blocking implantation of an impurity into an active region on the substrate is to be disposed, and a resist pattern determining step of determining the resist pattern by retreating a contour of the resist pattern at a site where a part of the place where the gate wiring is to be disposed, which part is located on the active region, as defined by the first data and the place where the resist pattern is to be disposed as defined by the second data are near to each other by a predetermined distance or less so that the contour of the resist pattern may be located away from the part to correspond to a shape of the part. By adopting this method, one can avoid a situation in which the trailing part covers the active region even if the trailing phenomenon occurs at the site where the part of the place where the gate wiring is to be disposed, which part is located on the active region, and the place where the resist pattern is to be disposed are near to each other.

In the aforesaid invention, the method of manufacturing a semiconductor device preferably further includes a trailing amount inputting step of receiving information on a magnitude of a trailing amount on the substrate, wherein the predetermined distance in the resist pattern determining step is defined in accordance with the magnitude of the trailing amount. By adopting this method, the contour of the resist pattern can be retreated by a more appropriate amount, so that the invasion of the trailing part into the active region can be avoided without wasting the limited space.

In the aforesaid invention, the method of manufacturing a semiconductor device preferably further includes a resist forming step of forming a resist film on the substrate for blocking the implantation of the impurity into the active region by photolithography in accordance with the pattern defined in the resist pattern determining step, and an implanting step of implanting the impurity into the substrate with the resist film used as a mask. By adopting this method, the impurity can be implanted into the active region without being hindered by the trailing part, so that the impurity can be implanted sufficiently over the entire region where it is planned to implant the impurity, thereby giving a loaded part having a range as desired.

In the aforesaid invention, the method of manufacturing a semiconductor device preferably further includes an antireflective film forming step of forming an antireflective film on an oxide film of the substrate having the active region and a region covered with the oxide film, and a removing step of removing the antireflective film, wherein the resist forming step forms the resist film on the antireflective film. By adopting this method, the trailing amount is stabilized by the antireflective film in addition to the fact that the contour of the resist pattern is retreated. Therefore, one can avoid a situation in which the trailing part covers the active region even if the trailing phenomenon occurs at the site where the part of the place where the gate wiring is to be disposed, which part is located on the active region, and the place where the resist pattern is to be disposed are near to each other.

In the aforesaid invention, the antireflective film is preferably made of a water-soluble material, and the removing step is preferably carried out simultaneously with photolithography development in the resist forming step so as to dissolve and remove the antireflective film. By adopting this method, the step of removing the antireflective film can be carried out simultaneously with the photolithography development, thereby reducing the total number of steps.

In the aforesaid invention, the antireflective film is preferably made of an inorganic material, and the removing step preferably includes a step of removing the antireflective film by plasma etching. By adopting this method, the antireflective film can be formed easily, and the antireflective film can be removed with certainty.

In the aforesaid invention, the antireflective film is preferably made of a water-insoluble organic material, and the removing step preferably includes a step of removing the antireflective film by ashing. By adopting this method, the antireflective film can be formed easily, and the antireflective film can be removed with certainty.

Also, in order to achieve the aforementioned object, a method of manufacturing a semiconductor device according to another aspect of the present invention includes an antireflective film forming step of forming an antireflective film on an oxide film of a substrate having an active region and a region covered with the oxide film, a resist forming step of forming a resist film on the antireflective film by photolithography for blocking implantation of an impurity into the active region, and a removing step of removing the antireflective film. By adopting this method, the trailing amount is stabilized by the antireflective film, thereby avoiding a situation where the trailing amount attains its maximum. Therefore, one can avoid a situation in which the trailing part covers the active region even if the trailing phenomenon occurs at the site where the part of the place where the gate wiring is to be disposed, which part is located on the active region, and the place where the resist pattern is to be disposed are near to each other.

In the aforesaid invention, the method of manufacturing a semiconductor device preferably further includes an implanting step of implanting the impurity into the active region with the resist film used as a mask. By adopting this method, the impurity can be implanted into the active region without being hindered by the trailing part, so that the impurity can be implanted sufficiently over the entire region where it is planned to implant the impurity, thereby giving a loaded part having a range as desired.

In the aforesaid invention, the antireflective film is preferably made of a water-soluble material, and the removing step is preferably carried out simultaneously with photolithography development in the resist forming step so as to dissolve and remove the antireflective film. By adopting this method, the step of removing the antireflective film can be carried out simultaneously with the photolithography development, thereby reducing the total number of steps.

In the aforesaid invention, the antireflective film is preferably made of an inorganic material, and the removing step preferably includes a step of removing the antireflective film by plasma etching. By adopting this method, the antireflective film can be formed easily, and the antireflective film can be removed with certainty.

In the aforesaid invention, the antireflective film is preferably made of a water-insoluble organic material, and the removing step preferably includes a step of removing the antireflective film by ashing. By adopting this method, the antireflective film can be formed easily, and the antireflective film can be removed with certainty.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
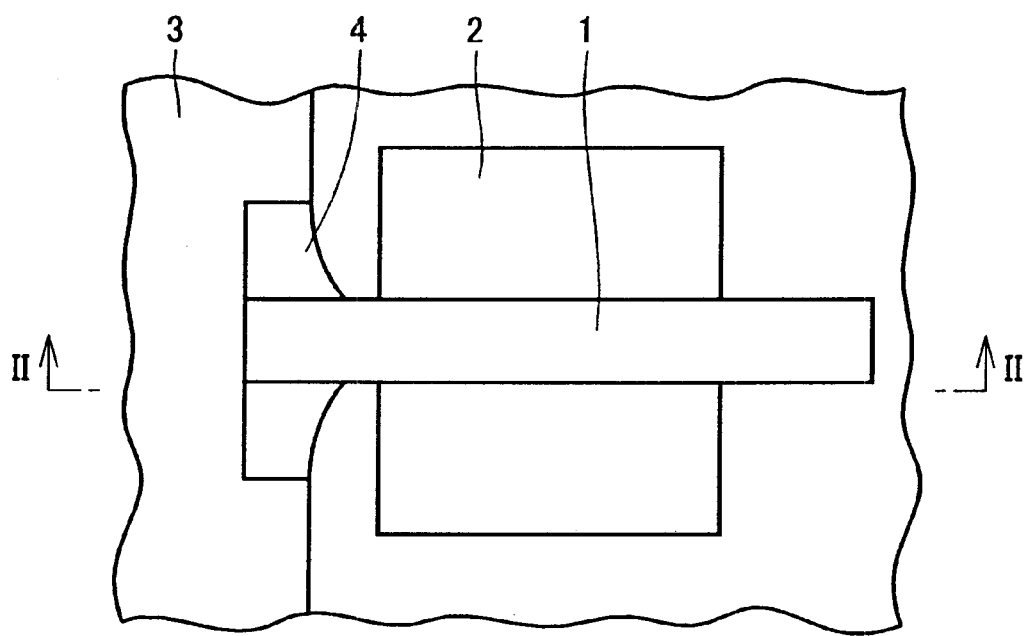
FIG. 1 is a plan view in one midway step in a method of manufacturing a semiconductor device according to embodiment 1 of the present invention.
Figure 2:
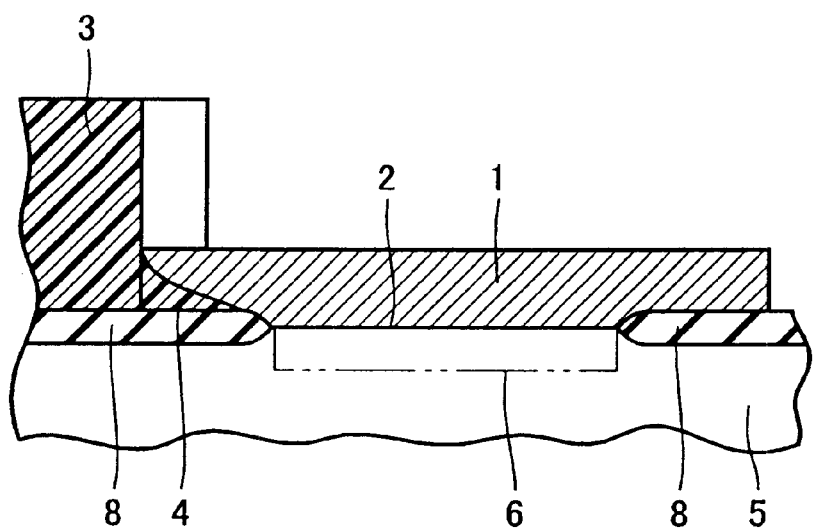
FIG. 2 is an arrow cross-sectional view with respect to line II—II of FIG. 1.

Referring to FIGS. 1 and 2, a method of manufacturing a semiconductor device according to embodiment 1 of the present invention will be described. FIG. 1 is a plan view illustrating a certain midway step in the production method. FIG. 2 is an arrow cross-sectional view with respect to line II—II of FIG. 1. As shown in these drawings, in the method of manufacturing a semiconductor device according to this embodiment, the resist pattern is made different from that of the prior art. Such a resist pattern can be formed through the following steps.

First, a place information inputting step is carried out to respectively receive the first data including information on the place where the gate wiring is to be disposed and the second data including information on the place where the resist pattern is to be disposed.

Next, a resist pattern determining step will be described. One examines the positional relationship between the part of the place where the gate wiring is to be disposed, which part is located on the active region, as defined by the first data and the place where the resist pattern is to be disposed as defined by the second data. At a site where the two are near to each other by a predetermined distance or less, the contour of the resist pattern is retreated so that the contour of the resist pattern may be located away from the part of the gate wiring located on the active region (hereafter referred to as "gate wiring part on the active region") to correspond to the shape of the gate wiring part on the active region. The obtained resist pattern is determined as a new resist pattern.

The place information inputting step and the resist pattern determining step may be carried out using a CAD(computer aided design) system.

Figure 3:
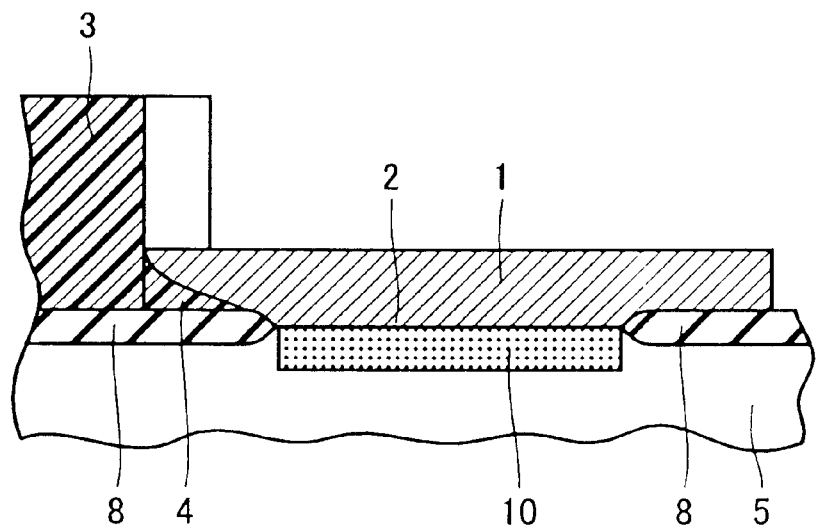
FIG. 3 is a cross-sectional view in another midway step in the method of manufacturing a semiconductor device according to embodiment 1 of the present invention.

Further, after the resist pattern determining step, it is preferable to perform a resist forming step of forming a resist film by photolithography in accordance with the determined resist pattern. Still further, an implanting step is carried out to implant an ion seed as an impurity into the semiconductor substrate with the resist film used as a mask. FIG. 3 shows a cross-sectional view corresponding to FIG. 2 in a state after the implantation.

In this embodiment, the contour of the resist pattern is retreated at a site where the part of the place where the gate wiring is to be disposed, which part is located on the active region, and the place where the resist pattern is to be disposed are near to each other by a predetermined distance or less. Therefore, even if the trailing phenomenon occurs, trailing part 4 does not reach active region 2, as shown in FIGS. 1 and 2. As a result of this, the impurity can be implanted into active region 2 without being hindered by the trailing part, so that the impurity can be implanted sufficiently over the entire region 6 where it is planned to implant the impurity, thereby giving a loaded part 10 having a range as desired.

Figure 5:
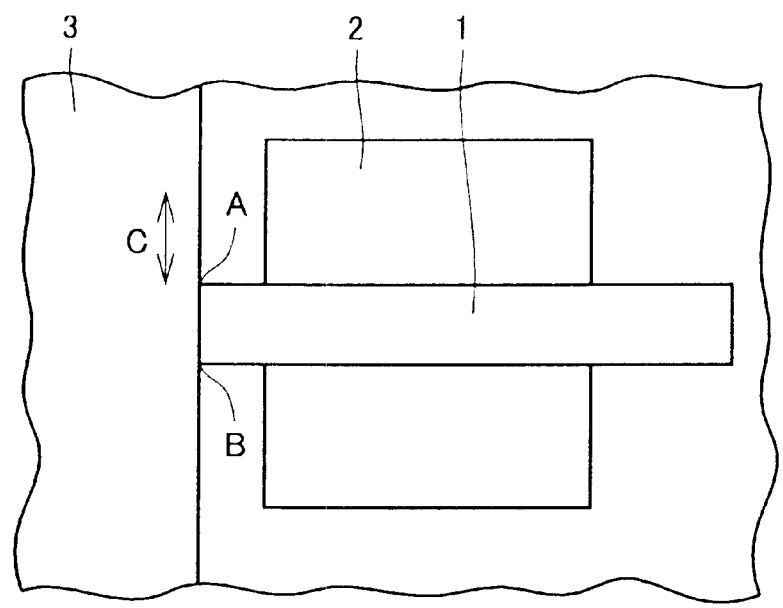
FIG. 5 is a second explanatory view of a resist pattern determining step included in the method of manufacturing a semiconductor device according to the first embodiment of the present invention.
Figure 6:
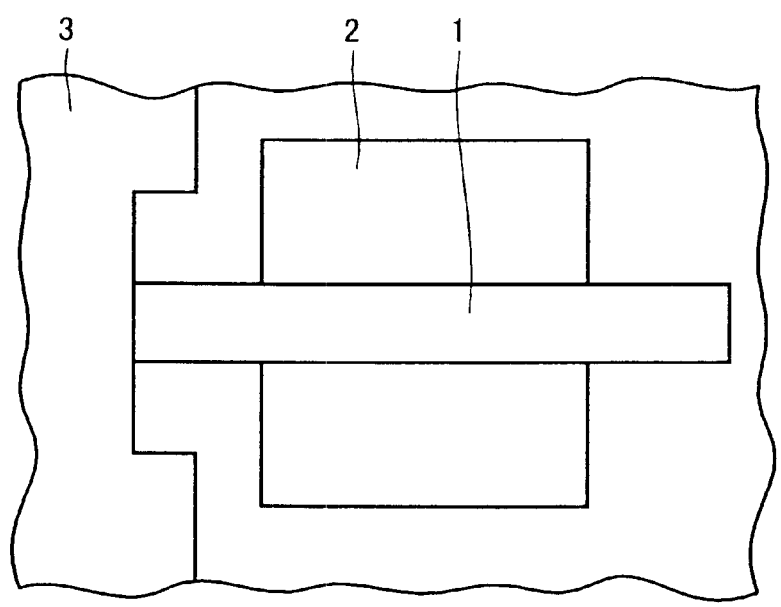
FIG. 6 is a third explanatory view of a resist pattern determining step included in the method of manufacturing a semiconductor device according to the first embodiment of the present invention.

As a method of retreating the contour of the resist pattern in the above-mentioned resist pattern determining step, the procedure will be described in detail more specifically referring to FIGS. 4 to 6.

Figure 4:
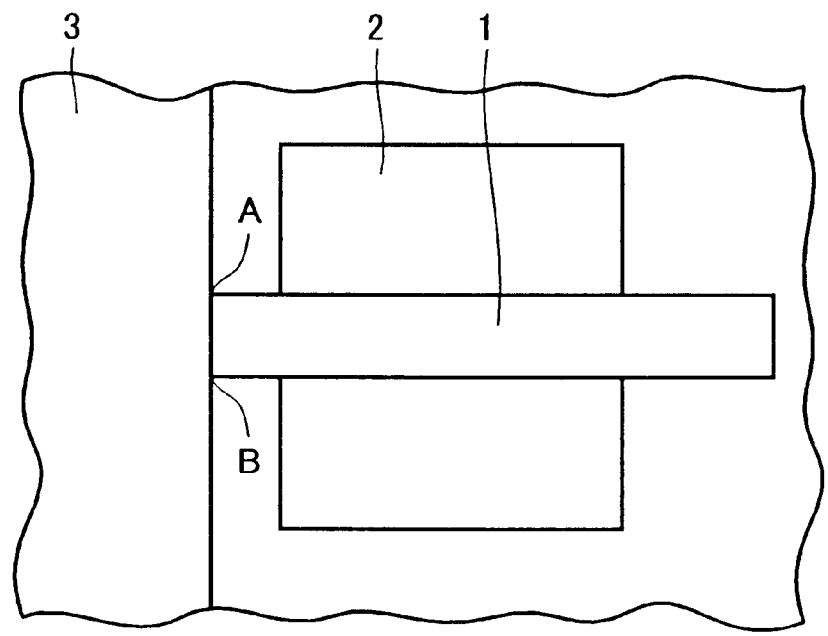
FIG. 4 is a first explanatory view of a resist pattern determining step included in the method of manufacturing a semiconductor device according to a first embodiment of the present invention.

First, it is assumed that a layout defined by the first data and the second data is as shown in FIG. 4. Namely, gate wiring 1 extends in a shape that invades perpendicularly into resist film 3. In this case, the part of gate wiring 1 located on the active region corresponds to the aforesaid gate wiring part on the active region. The original idea is to retreat the contour of resist film 3 away from the gate wiring part on the active region in accordance with the place at which the gate wiring part on the active region and resist film 3 are near to each other. However, if gate wiring 1 invades directly into resist film 3 outside the active region from the gate wiring part on the active region in such a manner, the following procedure can be adopted as a more simplified method of determining the resist pattern. As shown in FIG. 4, points A and B at both ends of the connection site, as viewed, of gate wiring 1 and resist film 3 are extracted. As shown in FIG. 5, a distance C is respectively set on both sides along the contour line of resist film 3 from points A and B. As shown in FIG. 6, within the region where the distance C is set, the contour line of resist film 3 is retreated by a predetermined amount. Thus, a resist pattern is determined.

Figure 7:
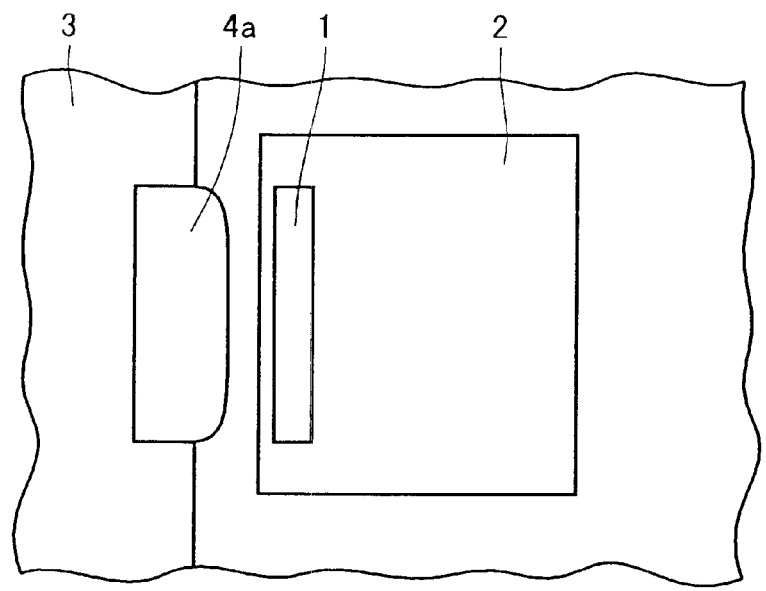
FIG. 7 is a plan view of another arrangement example in one midway step in the method of manufacturing a semiconductor device according to the first embodiment of the present invention.
Figure 15:
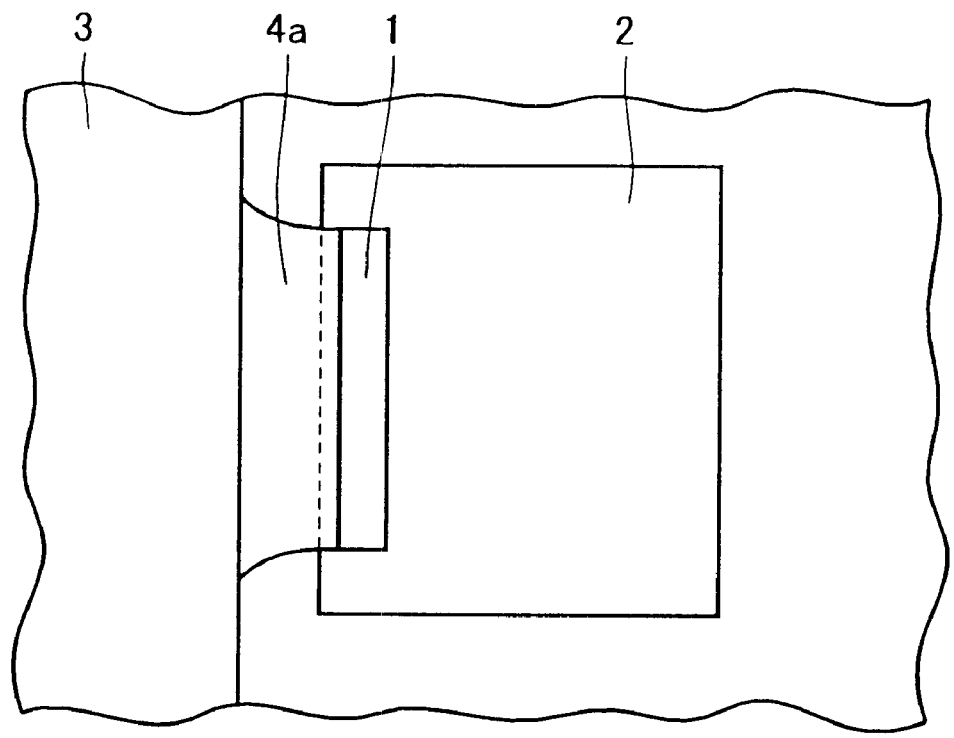
FIG. 15 is another explanatory view for explaining a problem in the method of manufacturing a semiconductor device according to a prior art.

In the above example, gate wiring 1 invades perpendicularly into resist film 3; however, the present invention can be applied to a case in which gate wiring 1 extends generally in parallel with the contour line of resist film 3 within active region 2, as shown in FIG. 7. In this case, as already described referring to FIG. 15, the occurrence of trailing part 4a is a problem. In order to apply the present invention in such an arrangement of gate wirings, since the entire gate wiring 1 corresponds to the gate wiring part on the active region, the part of the contour line of resist film 3 corresponding to the length thereof is retreated. As a result of this, a resist pattern such as shown in FIG. 7 is obtained. If the resist pattern has a recessed site as viewed from above in such a manner, the inside of the recess is not sufficiently exposed even if light is radiated in accordance with the resist pattern, so that trailing part 4a occurs as shown in FIG. 7. Trailing part 4a is generated to go a little outside of the original contour line of the resist pattern; however, trailing part 4a does not reach the inside of active region 2, so that no problem is raised.

(Second Embodiment)

Figure 8:
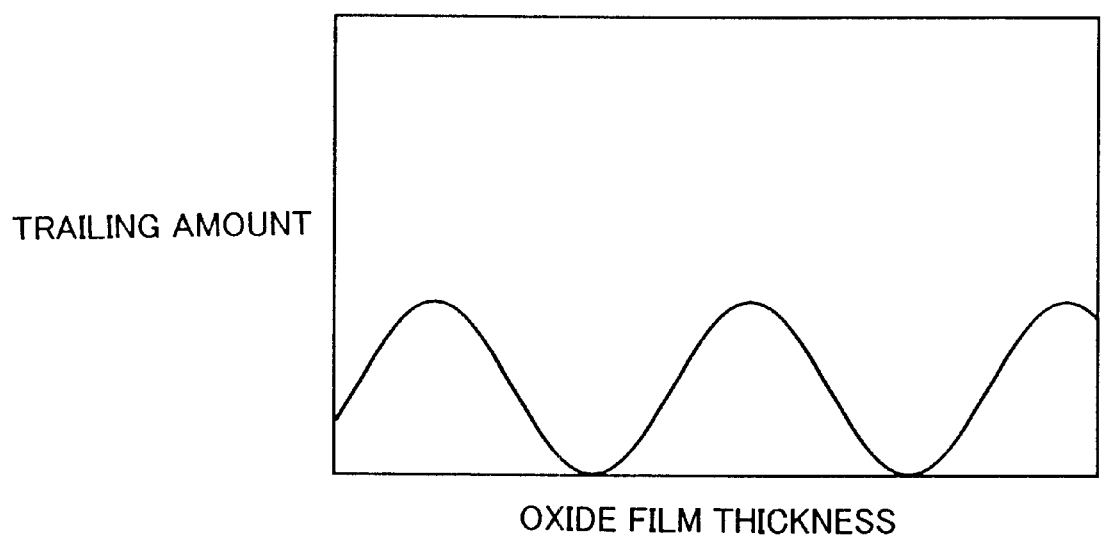
FIG. 8 is a graph illustrating a relationship between the oxide film thickness and the trailing amount according to a prior art, shown as an object of comparison in a second embodiment of the present invention.

FIG. 8 shows a relationship between the oxide film thickness and the trailing amount. Here, the "trailing amount" refers to the length of trailing part 4 as measured in the right-and-left direction of FIG. 1 when trailing part 4 is formed to have a shape such as shown in FIG. 1.

Referring to FIG. 8, according as the oxide film thickness increases, the trailing amount fluctuates to repeatedly increase and decrease. The repetition of the same increase and decrease is due to the following reason. When light is radiated from above for exposure, the light successively transmitted through the resist film and the oxide film from above and reflected at the bottom surface of the oxide film interferes with the light transmitted through the resist film from above and being incident into the oxide film, whereby the light beams are superposed or cancelled with each other depending on the condition of the oxide film thickness.

Figure 9:
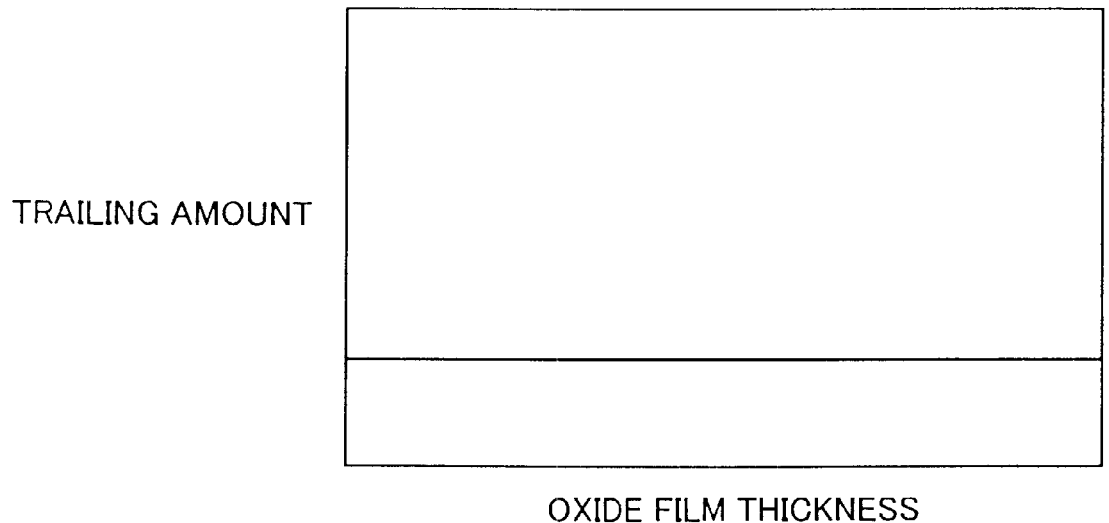
FIG. 9 is a graph illustrating a relationship between the oxide film thickness and the trailing amount when a resist film is formed on an antireflective film in the second embodiment of the present invention.

In order to deal with this problem, the inventors of the present invention have created an idea of forming an antireflective film (also referred to as "ARC(anti-reflective coating)") on the semiconductor substrate before the resist film is formed on the semiconductor substrate and then forming a resist film such as in the prior art on this antireflective film, whereby it has been found out that the trailing amount assumes a stable value irrespective of the oxide film thickness, as shown in FIG. 9.

Figure 10:
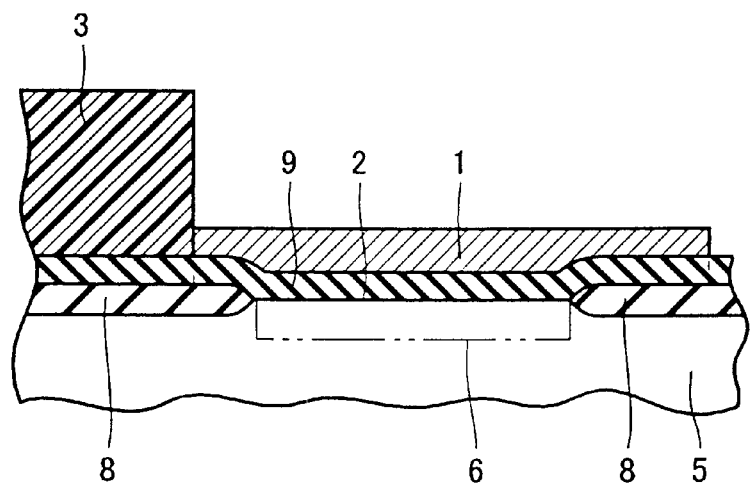
FIG. 10 is a cross-sectional view of a first step in the method of manufacturing a semiconductor device according to the second embodiment of the present invention.

An example of using an antireflective film will be described referring to FIGS. 10 to 12. Referring to FIG. 10, an antireflective film 9 is formed on the upper side of an oxide film 8, and photolithography is carried out thereon to form a resist film 3 in accordance with a desired resist pattern. FIG. 10 shows a state in which the photolithography of resist film 3 is completed. If antireflective film 9 is made of an inorganic material or a water-insoluble organic material, a removing step of removing the antireflective film is carried out after the photolithography is completed. If antireflective film 9 is made of an inorganic material, the removing step can be carried out by plasma etching. If antireflective film 9 is made of a water-insoluble organic material, the removing step can be carried out by ashing.

If antireflective film 9 is made of water-soluble material, the step of removing the antireflective film can be carried out by washing antireflective film 9 located under the exposed resist film simultaneously with washing the exposed resist film with a developing solution at the time of photolithography development, so that it is more preferable.

Figure 11:
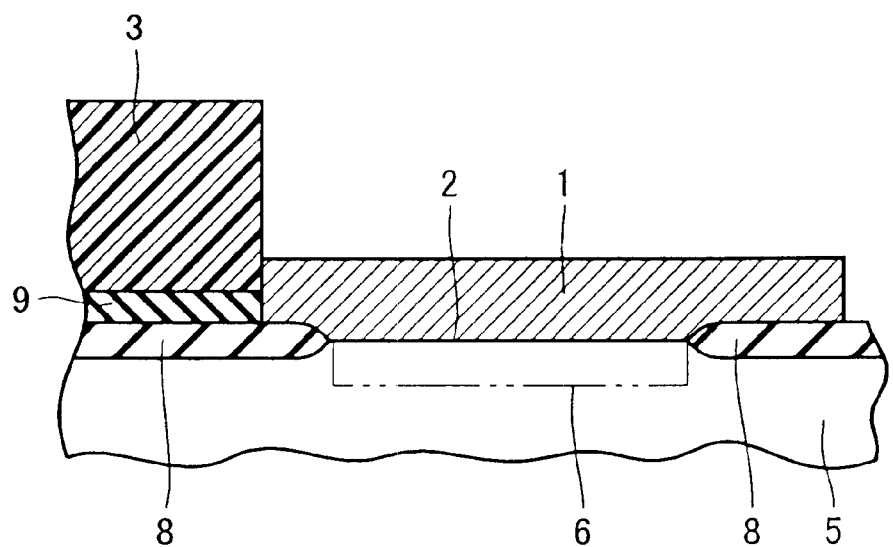
FIG. 11 is a cross-sectional view of a second step in the method of manufacturing a semiconductor device according to the second embodiment of the present invention.
Figure 12:
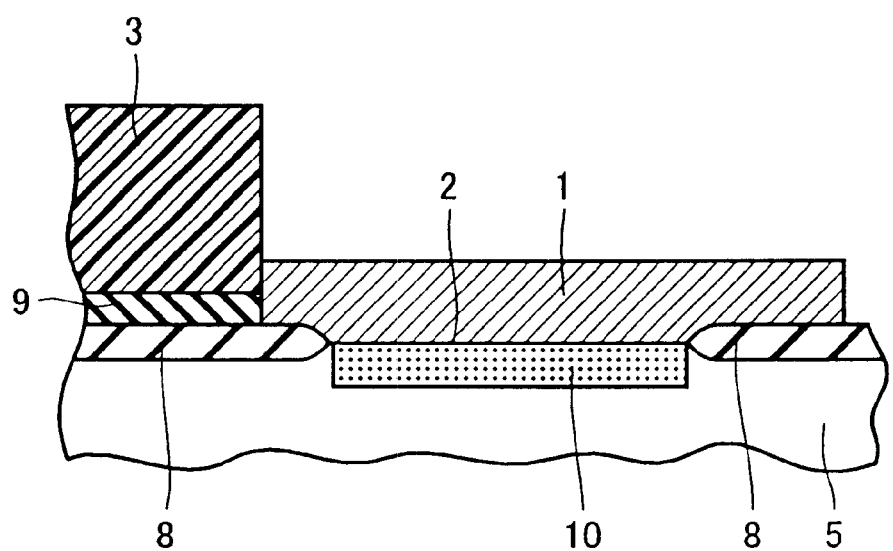
FIG. 12 is a cross-sectional view of a third step in the method of manufacturing a semiconductor device according to the second embodiment of the present invention.
Figure 13:
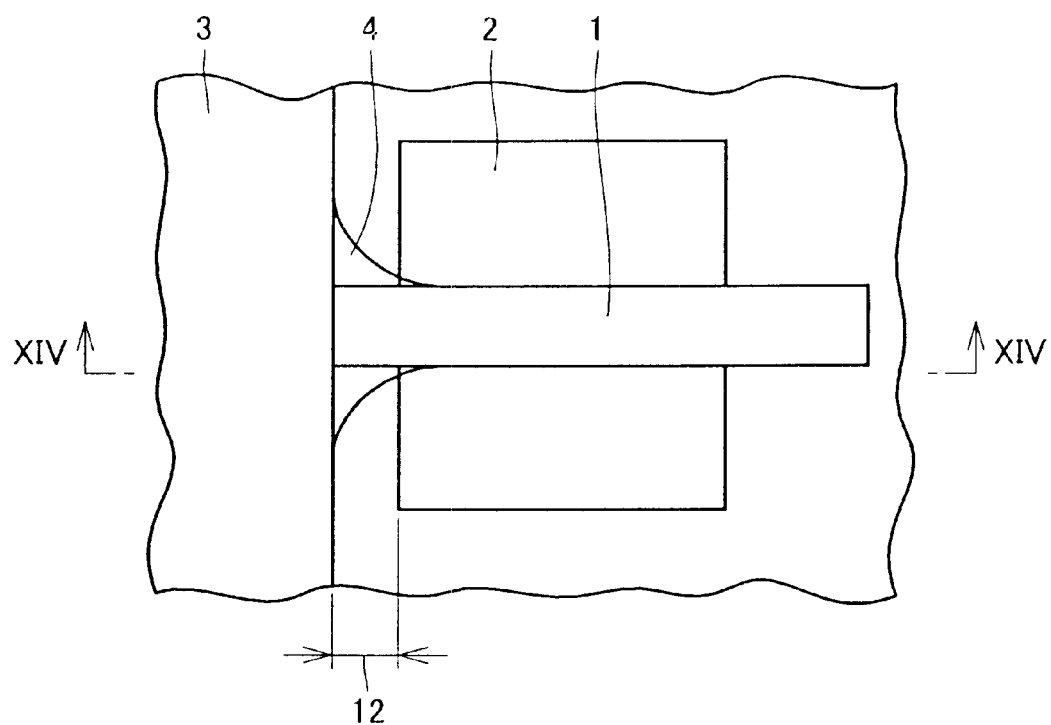
FIG. 13 is a plan view for explaining a problem in the method of manufacturing a semiconductor device according to a prior art.
Figure 14:
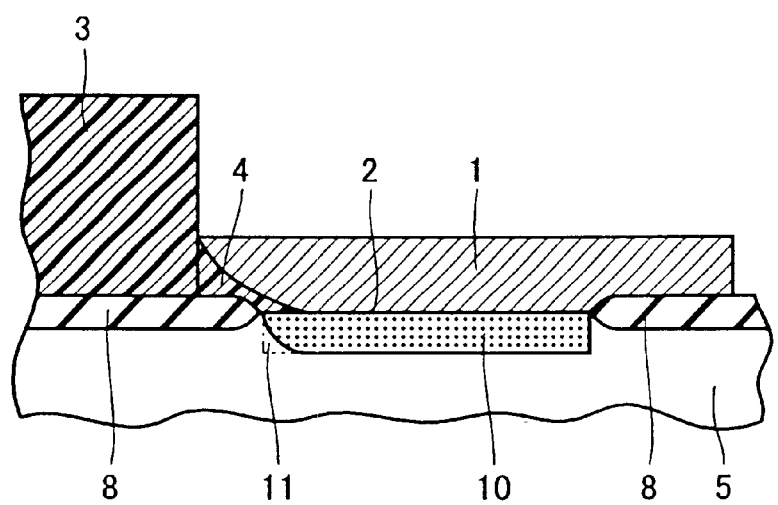
FIG. 14 is an arrow cross-sectional view with respect to line XIV—XIV of FIG. 13.

Thus, the state shown in FIG. 11 is brought about. In FIG. 10, illustration of the trailing part is not omitted; however, the trailing part may exit in a little amount.

For example, in a conventional case in which the trailing part invades into the active region near the maximum point of FIG. 8, the use of an antireflective film stabilizes the length of the trailing part without being affected by the oxide film thickness. Therefore, even if the trailing part remains, the trailing part can be prevented from invading into the active region. Further, since the trailing part is sufficiently thin as compared with resist film 3 to be left, the trailing part also can be removed together if the step of removing antireflective film 9 is carried out after completion of photolithography and before implantation of an impurity or at the time of photolithography development. In FIG. 11, the trailing part is already absent for this reason. In the state of FIG. 11, an impurity is implanted into a region 6 of the active region 2 where it is planned to implant an impurity, whereby a loaded part 10 having a range as desired is obtained as shown in FIG. 12.

Here, in the first embodiment, a method of retreating the contour of the resist pattern under a certain condition has been described, while in the second embodiment, a method of using an antireflective film has been described; however, the two methods may be used in combination. If the two methods are used in combination, it is more effective.

According to the present invention, the contour of the resist pattern is retreated at the site where a part of the place where the gate wiring is to be disposed, which part is located on the active region, and the place where the resist pattern is to be disposed are near to each other. Therefore, even if the trailing phenomenon occurs, one can avoid a situation in which the trailing part covers the active region. Thus, the impurity can be implanted into the active region without being hindered by the trailing part, so that the impurity can be implanted sufficiently over the entire region where it is planned to implant the impurity, thereby giving a loaded part having a range as desired.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a resist pattern comprising:
a place information inputting step of receiving a first data including information on a place where a wiring is to be disposed on a substrate and a second data including information on a place where a resist pattern for blocking implantation of an impurity into an active region on said substrate is to be disposed; and
a resist pattern determining step of determining said resist pattern by retreating a contour of said resist pattern at a site where a part of the place where the wiring is to be disposed, which part is located on said active region, as defined by said first data and the place where said resist pattern is to be disposed as defined by said second data are near to each other by a predetermined distance or less so that the contour of said resist pattern may be located away from said part to correspond to a shape of said part.

2. A method of manufacturing a semiconductor device comprising:
a place information inputting step of receiving a first data including information on a place where a gate wiring is to be disposed on a substrate and a second data including information on a place where a resist pattern for blocking implantation of an impurity into an active region on said substrate is to be disposed; and
a resist pattern determining step of determining said resist pattern by retreating a contour of said resist pattern at a site where a part of the place where the gate wiring is to be disposed, which part is located on said active region, as defined by said first data and the place where said resist pattern is to be disposed as defined by said second data are near to each other by a predetermined distance or less so that the contour of said resist pattern may be located away from said part to correspond to a shape of said part.

3. The method of manufacturing a semiconductor device according to claim 2, further comprising a trailing amount inputting step of receiving information on a magnitude of a trailing amount on said substrate, wherein said predetermined distance in said resist pattern determining step is defined in accordance with the magnitude of said trailing amount.

4. The method of manufacturing a semiconductor device according to claim 2, further comprising:
   a resist forming step of forming a resist film on said substrate for blocking the implantation of the impurity into said active region by photolithography in accordance with the pattern defined in said resist pattern determining step; and
   an implanting step of implanting the impurity into said substrate with said resist film used as a mask.

5. The method of manufacturing a semiconductor device according to claim 2, further comprising:
   an antireflective film forming step of forming an antireflective film on an oxide film of said substrate having said active region and a region covered with said oxide film; and
   a removing step of removing said antireflective film,
   wherein said resist forming step forms said resist film on said antireflective film.

6. The method of manufacturing a semiconductor device according to claim 5, wherein said antireflective film is made of a water-soluble material, and said removing step is carried out simultaneously with photolithography development in said resist forming step so as to dissolve and remove said antireflective film.

7. The method of manufacturing a semiconductor device according to claim 5, wherein said antireflective film is made of an inorganic material, and said removing step includes a step of removing said antireflective film by plasma etching.

8. The method of manufacturing a semiconductor device according to claim 5, wherein said antireflective film is made of a water-insoluble organic material, and said removing step includes a step of removing said antireflective film by ashing.

9. A method of manufacturing a semiconductor device comprising:
   an antireflective film forming step of forming an antireflective film on an oxide film of a substrate having an active region and a region covered with said oxide film;
   a resist forming step of forming a resist film on said antireflective film by photolithography for blocking implantation of an impurity into said active region; and
   a removing step of removing said antireflective film.

10. The method of manufacturing a semiconductor device according to claim 9, further comprising an implanting step of implanting the impurity into said active region with said resist film used as a mask.

11. The method of manufacturing a semiconductor device according to claim 9, wherein said antireflective film is made of a water-soluble material, and said removing step is carried out simultaneously with photolithography development in said resist forming step so as to dissolve and remove said antireflective film.

12. The method of manufacturing a semiconductor device according to claim 9, wherein said antireflective film is made of an inorganic material, and said removing step includes a step of removing said antireflective film by plasma etching.

13. The method of manufacturing a semiconductor device according to claim 9, wherein said antireflective film is made of a water-insoluble organic material, and said removing step includes a step of removing said antireflective film by ashing.

* * * * *

UNITED STATES PATENT AND TRADEMARK OFFICE
CERTIFICATE OF CORRECTION

PATENT NO.    : 6,509,251 B2
DATED         : January 21, 2003
INVENTOR(S)   : Takayuki Saito et al.

It is certified that error appears in the above-identified patent and that said Letters Patent is hereby corrected as shown below:

Column 2,
Line 46, change "writing" to -- wiring --;

Column 7,
Line 63, delete "not";
Line 64, change "exit" to -- exist --;

Column 10,
Line 17, change "active region" to -- substrate --.

Signed and Sealed this

Thirteenth Day of May, 2003

JAMES E. ROGAN
*Director of the United States Patent and Trademark Office*